(12) United States Patent
Yang et al.

(10) Patent No.: US 12,211,815 B2
(45) Date of Patent: Jan. 28, 2025

(54) MICRO LED DISPLAY PANEL

(71) Applicant: PlayNitride Display Co., Ltd., Zhunan Township, Miaoli County (TW)

(72) Inventors: Shiang-Ning Yang, Zhunan Township (TW); Yung-Chi Chu, Zhunan Township (TW); Yu-Yun Lo, Zhunan Township (TW); Bo-Wei Wu, Zhunan Township (TW); Yu-Ya Peng, Zhunan Township (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 340 days.

(21) Appl. No.: 17/574,891

(22) Filed: Jan. 13, 2022

(65) Prior Publication Data

US 2023/0112423 A1  Apr. 13, 2023

(30) Foreign Application Priority Data

Oct. 13, 2021 (TW) .................. 110137889

(51) Int. Cl.
*H01L 25/16* (2023.01)
*H01L 23/00* (2006.01)
*H01L 33/38* (2010.01)

(52) U.S. Cl.
CPC .......... *H01L 24/16* (2013.01); *H01L 24/13* (2013.01); *H01L 25/167* (2013.01); *H01L 33/38* (2013.01);
(Continued)

(58) Field of Classification Search
CPC .................................................. H09L 124/16
See application file for complete search history.

(56) References Cited

U.S. PATENT DOCUMENTS 5,482,896 A * 1/1996 Tang .............. H10K 50/805
438/34
5,739,800 A * 4/1998 Lebby ............. H04N 23/55
345/82
(Continued)

FOREIGN PATENT DOCUMENTS

CN 107112403 A 8/2017
CN 109390437 A 2/2019
(Continued)

OTHER PUBLICATIONS

Chinse Office Action, issued on Mar. 28, 2024, for corresponding Chinese Application No. 202111193791.0.

*Primary Examiner* — William A Harriston
(74) *Attorney, Agent, or Firm* — Birch, Stewart, Kolasch & Birch, LLP

(57) ABSTRACT

A micro LED display panel is provided. The micro LED display panel includes a driving substrate and a plurality of bonding pads disposed on the driving substrate and spaced apart from each other. The micro LED display panel also includes a plurality of micro LED structures electrically connected to the bonding pads. Each micro LED structure includes at least one electrode disposed on the side of the micro LED structure facing the driving substrate. The electrode has a normal contact surface and a side contact surface. The normal contact surface faces the driving substrate, and the side contact surface is laterally connected to the corresponding bonding pad.

10 Claims, 13 Drawing Sheets

(52) U.S. Cl.
CPC .............. *H01L 24/10* (2013.01); *H01L 24/81* (2013.01); *H01L 24/98* (2013.01); *H01L 2224/10145* (2013.01); *H01L 2224/13012* (2013.01); *H01L 2224/13013* (2013.01); *H01L 2224/16105* (2013.01); *H01L 2224/16148* (2013.01); *H01L 2224/81203* (2013.01); *H01L 2224/98* (2013.01)

(56) References Cited

U.S. PATENT DOCUMENTS

| | | | | |
|---|---|---|---|---|
| 6,573,610 | B1* | 6/2003 | Tsai | H01L 24/81 |
| | | | | 257/E21.511 |
| 9,105,813 | B1* | 8/2015 | Chang | H01L 33/44 |
| 9,537,057 | B2* | 1/2017 | Huang | H01L 33/62 |
| 9,685,402 | B2* | 6/2017 | Chen | H01L 22/12 |
| 10,388,825 | B2* | 8/2019 | Lin | H01L 21/6835 |
| 10,410,998 | B2* | 9/2019 | Kim | H01L 25/0753 |
| 10,672,805 | B2* | 6/2020 | Lee | H01L 25/13 |
| 11,342,377 | B2* | 5/2022 | Chen | H01L 33/38 |
| 11,342,480 | B2* | 5/2022 | Liang | G01R 31/2635 |
| 2002/0158110 | A1* | 10/2002 | Caletka | H05K 3/3436 |
| | | | | 257/E23.068 |
| 2006/0125910 | A1* | 6/2006 | Shie | B41J 2/45 |
| | | | | 347/224 |
| 2011/0198649 | A1* | 8/2011 | Yamada | H01L 33/486 |
| | | | | 257/E33.068 |
| 2012/0037942 | A1* | 2/2012 | Sanga | H01L 33/60 |
| | | | | 257/98 |
| 2013/0127042 | A1* | 5/2013 | Lee | H01L 23/3128 |
| | | | | 257/737 |
| 2013/0146872 | A1* | 6/2013 | Chen | H01L 24/10 |
| | | | | 257/E23.01 |
| 2013/0147035 | A1* | 6/2013 | Chen | H01L 23/49838 |
| | | | | 257/737 |
| 2014/0061585 | A1* | 3/2014 | Doan | H01L 25/0753 |
| | | | | 257/13 |
| 2015/0179884 | A1 | 6/2015 | Kang et al. | |
| 2015/0295142 | A1* | 10/2015 | Huang | H01L 33/62 |
| | | | | 438/26 |
| 2015/0325748 | A1* | 11/2015 | Ting | H01L 33/486 |
| | | | | 257/98 |
| 2015/0333227 | A1* | 11/2015 | Lee | H01L 33/56 |
| | | | | 438/27 |
| 2016/0086929 | A1* | 3/2016 | Ting | H01L 33/486 |
| | | | | 257/88 |
| 2016/0254428 | A1* | 9/2016 | Ting | H01L 33/486 |
| | | | | 257/99 |
| 2016/0322539 | A1* | 11/2016 | Zhang | H01L 33/58 |
| 2017/0125645 | A1* | 5/2017 | Ting | H01L 33/502 |
| 2017/0229430 | A1* | 8/2017 | Lai | H01L 25/0753 |
| 2017/0256522 | A1* | 9/2017 | Cok | H01L 25/50 |
| 2018/0315742 | A1 | 11/2018 | Zhang et al. | |
| 2019/0049760 | A1* | 2/2019 | Hyun | G02F 1/1335 |
| 2019/0148415 | A1* | 5/2019 | Lee | H01L 25/13 |
| | | | | 257/71 |
| 2019/0181317 | A1* | 6/2019 | Yu | H01L 25/0753 |
| 2019/0267360 | A1* | 8/2019 | Wei | H01L 33/007 |
| 2019/0319015 | A1* | 10/2019 | Schuele | H01L 25/0753 |
| 2020/0243739 | A1* | 7/2020 | Fukaya | H05K 3/32 |
| 2021/0091057 | A1* | 3/2021 | Liang | H01L 24/11 |
| 2021/0098646 | A1* | 4/2021 | Liang | H01L 25/0753 |
| 2021/0135044 | A1* | 5/2021 | Zou | H01L 27/156 |
| 2021/0217804 | A1* | 7/2021 | Takagi | H01L 27/156 |
| 2021/0391517 | A1* | 12/2021 | Chuang | H01L 25/0753 |
| 2022/0013507 | A1* | 1/2022 | Zhang | H01L 25/0753 |
| 2022/0045242 | A1* | 2/2022 | Ikeda | H01L 33/38 |
| 2022/0131044 | A1* | 4/2022 | Li | H01L 27/156 |
| 2022/0165925 | A1* | 5/2022 | Kishimoto | H01L 33/0093 |
| 2022/0199862 | A1* | 6/2022 | Liang | H01L 21/683 |
| 2023/0036183 | A1* | 2/2023 | Xu | H01L 25/167 |
| 2023/0097502 | A1* | 3/2023 | Liang | H01L 24/05 |
| | | | | 257/89 |
| 2023/0197648 | A1* | 6/2023 | Hu | H01L 24/29 |
| | | | | 257/91 |
| 2023/0197907 | A1* | 6/2023 | Yanagisawa | H01L 33/38 |
| | | | | 257/79 |
| 2023/0343904 | A1* | 10/2023 | Ding | H01L 33/46 |
| 2023/0352390 | A1* | 11/2023 | Kim | H01L 21/4857 |
| 2023/0378414 | A1* | 11/2023 | Liang | H01L 24/13 |

FOREIGN PATENT DOCUMENTS

| | | |
|---|---|---|
| CN | 112018145 A | 12/2020 |
| TW | 201929191 A | 7/2019 |
| WO | WO97/28565 A1 | 8/1997 |

* cited by examiner

MICRO LED DISPLAY PANEL

CROSS REFERENCE TO RELATED APPLICATIONS

This Application claims priority of Taiwan Patent Application No. 110137889, filed on Oct. 13, 2021, the entirety of which is incorporated by reference herein.

BACKGROUND

Technical Field

Embodiments of the present disclosure relate in general to an LED display device, and in particular they relate to a micro LED display panel, wherein the micro LED structure of the micro LED display panel is laterally connected to the bonding pad of the driving structure by the side contact surface of the electrode.

Description of the Related Art

With the advancements being made in photoelectric technology, the size of photoelectric components is gradually becoming smaller. Compared to organic light-emitting diodes (OLED), micro light-emitting diodes (micro LED, mLED/μLED) have advantages such as higher efficiency, longer life, and relatively stable materials that are not as easily affected by the environment. Therefore, displays that use micro LEDs fabricated in arrays have gradually gained attention in the market.

In a typical micro LED display panel, the electrodes of the micro LED are frontally bonded (i.e., normally bonded) to bumps on the substrate to electrically connect the micro LED and the substrate. With the miniaturization of micro LED structures, the area of the electrodes in each micro LED structure also shrinks. When the electrodes of the micro LED are bonded to the humps on the substrate, a horizontal shift may occur, which may likely lead to an open circuit or a short circuit.

Moreover, when a faulty micro LED needs to be repaired or removed, the micro LED is often removed from the back of the substrate by laser trimming. However, because the bumps are made of metal materials which are prone to reflect the laser, the laser energy, as normally bonding, is blocked by the bumps on the substrate, so that it is difficult for the laser to act on the interface between the electrodes and the bumps. Under this restriction, the existing laser trimming process can only directly melt the bumps on the substrate and re-manufacture them in place, and cannot be reused. That is, it is difficult for the existing front-bonding method to perform non-destructive removal with debonding.

Another trimming method is to reserve other spaces on the substrate to set additional bumps. After removing the faulty micro LED using laser trimming, the repaired micro LED is bonded to the extra bumps. However, the pixel spaces of the micro LED display panel will be occupied by this method, which is not conducive to increasing the pixel density of the display.

SUMMARY

The micro LED display panel in the embodiments of the present disclosure includes a plurality of micro LED structures. Since each micro LED structure is laterally connected to the bonding pad on the driving substrate by the side contact surface of the electrode, when the contact surface between the electrode and the bonding pad is irradiated (for example from the back of the driving substrate) by the laser to debond the faulty micro LED structure, the bonding pad is only partially melted at the contact surface. Therefore, the bonding pad may be reused, and there is no need to reserve other spaces for additional bonding pads or to re-make bonding pads. In addition, the space of the removed micro LED structure may directly accommodate (bond) a new micro LED structure.

Some embodiments of the present disclosure include a micro LED display panel. The micro LED display panel includes a driving substrate and a plurality of bonding pads disposed on the driving substrate and spaced apart from each other. The micro LED display panel also includes a plurality of micro LED structures electrically connected to the bonding pads. Each micro LED structure includes at least one electrode disposed on the side of the micro LED structure facing the driving substrate. The electrode has a normal contact surface and a side contact surface. The normal contact surface faces the driving substrate, and the side contact surface is laterally connected to the corresponding bonding pad.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
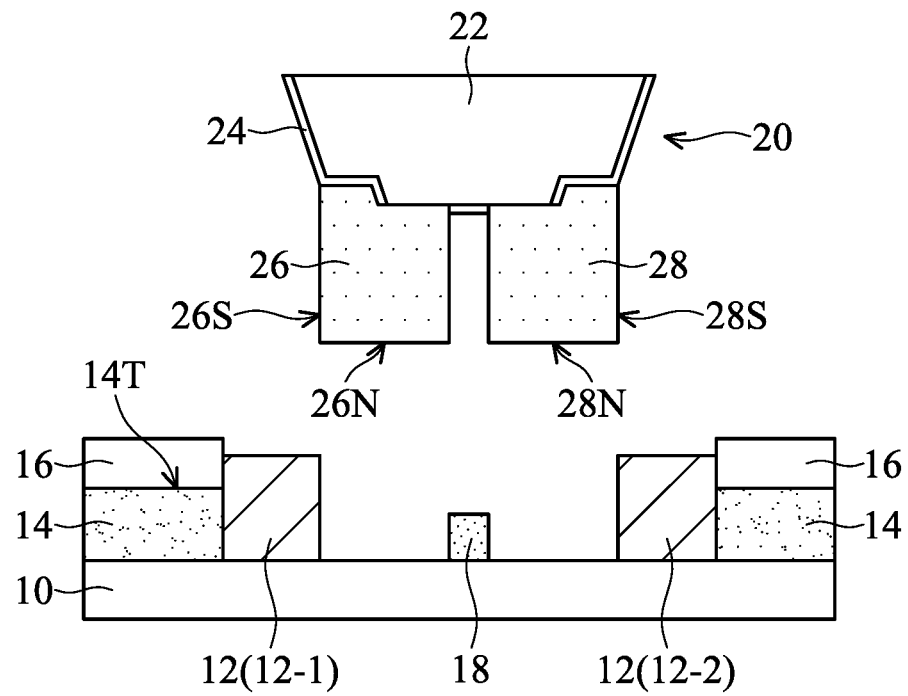
FIG. 1A to FIG. 1B are partial cross-sectional views illustrating various stages of transferring the micro LED structure onto the driving substrate to form the micro LED display panel according to an embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean ±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about,"; "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 1B:
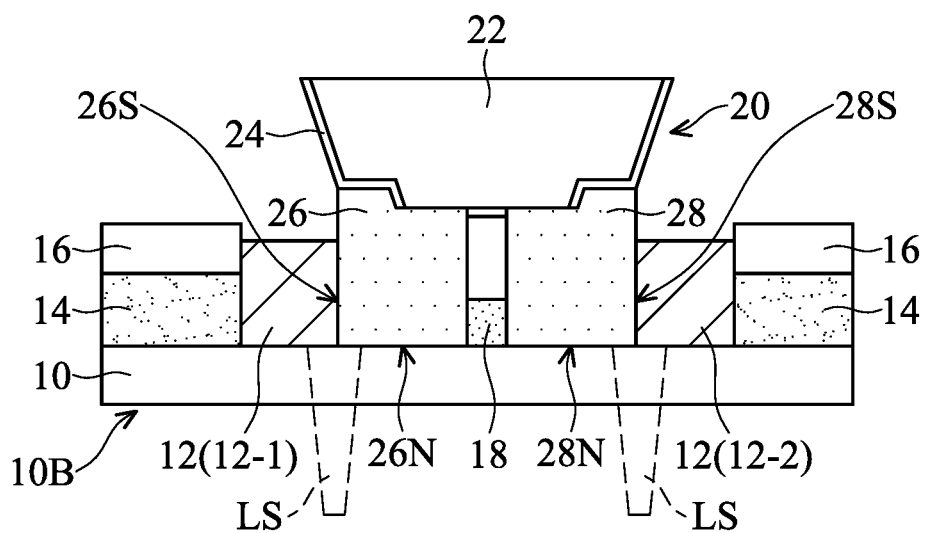

FIG. 1A to FIG. 1B are partial cross-sectional views illustrating various stages of transferring the micro LED structure 20 onto the driving substrate 10 to form the micro LED display panel 100 according to an embodiment of the present disclosure. It should be noted that some components of the micro LED display panel 100 have been omitted in FIG. 1A and FIG. 1B in order to show the technical features of the embodiments of the present disclosure more clearly.

Referring to FIG. 1A, in some embodiments, a driving substrate 10 is provided. The driving substrate 10 may be for example, a display substrate, a light-emitting substrate, a substrate with functional elements such as thin-film transistors (TFT) or integrated circuits (IC), or other types of circuit substrates, but the present disclosure is not limited thereto. For example, the driving substrate 10 may be a bulk semiconductor substrate or include a composite substrate formed of different materials, and the driving substrate 10 may be doped (e.g., using p-type or n-type dopants) or undoped. In addition, the driving substrate 10 may include a semiconductor substrate, a glass substrate, or a ceramic substrate, such as a silicon substrate, a silicon germanium substrate, a silicon carbide substrate, an aluminum nitride substrate, a sapphire substrate, the like, or a combination thereof, but the present disclosure is not limited thereto.

Referring to FIG. 1A, in some embodiments, multiple bonding pads 12 are formed on the driving substrate 12. As shown in FIG. 1A, in some embodiments, the bonding pads 12 are spaced apart from each other and disposed on the driving substrate 12. The bonding pad 12 includes a conductive material, such as metal, metal silicide, the like, or a combination thereof, but the present disclosure is not limited thereto. For example, the metal may include gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto.

Moreover, the bonding pads 12 may be spaced apart from each other and disposed on the driving substrate 12 by a deposition process and a patterning process. The deposition process may, for example, include chemical vapor deposition (CVD), atomic layer deposition (ALD), spin-on coating, the like, or a combination thereof, but the present disclosure is not limited thereto. The patterning process may include forming a mask layer (not shown) on the aforementioned material, and then etching the portion of the aforementioned material that is not covered by the mask layer to form the bonding pads 12 that are spaced apart from each other, but the present disclosure is not limited thereto.

As shows in FIG. 1A, in some embodiments, multiple distribution layers 14 are formed on the driving substrate 10, and the distribution layers 14 are electrically connected to the bonding pads 12. In particular, the distribution layers 14 may be in direct contact with the corresponding bonding pads 12. The distribution layer 14 includes a conductive material, such as metal, metal silicide, the like, or a combination thereof, but the present disclosure is not limited thereto. Examples of the metal are described above, which will not be repeated herein. The material of the distribution layers 14 may be the same as or different from the material of the bonding pad 12. For example, the distribution layers 14 may include copper (Cu), and the bonding pad 12 may include gold (Ag), but the present disclosure is not limited thereto. Moreover, the distribution layers 14 may be spaced apart from each other and disposed on the driving substrate 12 by a deposition process and a patterning process. Examples of the deposition process and the patterning process are described above, which will not be repeated herein.

As shown in FIG. 1A, in some embodiments, multiple passivation layers 16 are formed on the distribution layers 14. For example, the passivation layer 16 may include, for example, an oxide such as silicon oxide, a nitride such as silicon nitride, the like, or a combination thereof, but the present disclosure is not limited thereto. The passivation layers 16 may be formed on the distribution layers 14 by a deposition process. For example, the passivation layers 16 may be formed on the top surface 14T of the distribution layers 14 as shown in FIG. 1A, but the present disclosure is not limited thereto.

As shown in FIG. 1A, in some embodiments, multiple isolation structures 18 are formed on the driving substrate 10, and the isolation structures 18 are disposed on the side of the driving substrate 10 facing the micro LED structures 20. In particular, as shown in FIG. 1A, the isolation structure 18 may be disposed between a pair of bonding pads 12 (e.g., the bonding pad 12-1 and the bonding pad 12-2 shown in FIG. 1A), but the present disclosure is not limited thereto. The isolation structure 18 may include an inorganic compound (e.g., silicon oxide, silicon nitride) or an organic compound with electrical insulation. Moreover, the isolation structures 18 may be formed on the driving substrate 10 by a deposition process and a patterning process. Examples of the deposition process and the patterning process are described above, which will not be repeated herein.

Referring to FIG. 1A, in some embodiments, multiple micro LED structures 20 are provided. The micro LED structure 20 includes an epitaxial layer 22, and the epitaxial layer 22 includes a first-type semiconductor layer, a light-emitting layer disposed on the first-type semiconductor layer, and a second-type semiconductor layer disposed on the light-emitting layer. In other words, the light-emitting layer is disposed between the first-type semiconductor layer and the second-type semiconductor layer, but the present disclosure is not limited thereto.

The first-type semiconductor layer includes N-type semiconductor material. For example, the first-type semiconductor layer may include a group II-VI material (e.g. zinc selenide (ZnSe)) or a group III-V material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the first-type semiconductor layer may include dopants such as silicon (Si) or germanium (Ge), but the present disclosure is not limited thereto. Moreover, the first-type semiconductor layer may be a single-layer or multi-layer structure.

The light-emitting layer includes at least one undoped semiconductor layer or at least one low-doped semiconductor layer. For example, the light-emitting layer may be a quantum well (QW) layer, which may include indium gallium nitride ($In_xGa_{1-x}N$) or gallium nitride (GaN), but the present disclosure is not limited thereto. Alternately, the light-emitting layer may be a multiple quantum well (MQW) layer, but the present disclosure is not limited thereto. Moreover, the light-emitting layer may emit red light, green light, or blue light, but the present disclosure is not limited thereto. For example, the light-emitting layer may also emit white light, cyan light, magenta light, yellow light, any other color light, or a combination thereof.

The second-type semiconductor layer includes P-type semiconductor material. For example, the second-type semiconductor layer may include a group II-VI material (e.g., zinc selenide (ZnSe)) or a group III-V material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the second-type semiconductor layer may include dopants such as magnesium (Mg) or carbon (C), but the present disclosure is not limited thereto. Moreover, the second-type semiconductor layer may be a single-layer or multi-layer structure.

Referring to FIG. 1A, in some embodiments, the micro LED structure 20 also includes an electrode 26 and an electrode 28, the electrode 26 and the electrode 28 are disposed on the side of the micro LED structure 20 facing the driving substrate 10 and electrically connected to the epitaxial layer 22. For example, the electrode 26 and the electrode 28 may be electrically connected to the first-type semiconductor layer and the second-type semiconductor layer (not shown in detail in FIG. 1A and FIG. 1B) respectively, but the present disclosure is not limited thereto.

The electrode 26 and the electrode 28 include a conductive material, such as metal, metal silicide, the like, or a combination thereof, but the present disclosure is not limited thereto. For example, the metal may include gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto. The electrode 26 and the electrode 28 may be formed by physical vapor deposition (PVD), chemical vapor deposition (CVD), atomic layer deposition (ALD), evaporation, sputtering, the like, or a combination thereof, but the present disclosure is not limited thereto.

Referring to FIG. 1A, in some embodiments, the micro LED structure 20 further includes an insulating layer 24 disposed on the epitaxial layer 22. The insulating layer 24 may include, for example, an oxide such as silicon oxide, a nitride such as silicon nitride, the like, or a combination thereof, but the present disclosure is not limited thereto. The insulating layer 24 may be formed on the surface of the epitaxial layer 22 facing the driving substrate 10 and the side surface of the epitaxial layer 22, but the present disclosure is not limited thereto. Moreover, a patterning process may be performed to remove a portion of the insulating layer 24, so that the electrode 26 and the electrode 28 are electrically connected to the epitaxial layer 22, but the present disclosure is not limited thereto. Examples of the deposition process and the patterning process are described above, which will not be repeated herein.

Referring to FIG. 1B, the micro LED structures 20 and the driving substrate 10 are bonded to form the micro LED display panel 100. For example, multiple micro LED structures 20 (only one micro LED structure 20 is shown in FIG. 1B) may be transferred onto the driving substrate 10 by a (thermo-)compression bonding process, but the present disclosure is not limited thereto. As shown in FIGS. 1A and 1B, in some embodiments, the electrode 26 has a normal contact surface 26N and a side contact surface 26S, the normal contact surface 26N faces the driving substrate 10, and the side contact surface 26S is laterally connected to the corresponding bonding pad 12 (i.e., 12-1). Similarly, as shown in FIGS. 1A and 1B, in some embodiments, the electrode 28 has a normal contact surface 28N and a side contact surface 28S, the normal contact surface 28N faces the driving substrate 10, and the side contact surface 28S is laterally connected to the corresponding bonding pad 12 (i.e., 12-2).

As shown in FIG. 1B, in the embodiment of the present disclosure, the micro LED display panel 100 includes a driving substrate 10 and a plurality of bonding pads 12 disposed on the driving substrate 10 and spaced apart from each other. The micro LED display panel 100 also includes a plurality of micro LED structures 20 electrically connected to the bonding pads 12. Each micro LED structure 20 includes at least one electrode (26 or 28) disposed on the side of the micro LED structure 20 facing the driving substrate 10. The electrode (26 or 28) has a normal contact surface (26N or 28N) and a side contact surface (26S or 28S), the normal contact surface (26N or 28N) faces the driving substrate 10, and the side contact surface (26S or 28S) is laterally connected to the corresponding bonding pad 12.

As shown in FIG. 1B, in some embodiments, the normal contact surface 26N of the electrode 26 and the normal contact surface 28N of the electrode 28 are both in direct contact with the driving substrate 10. In some other embodiments, the driving substrate 10 may additionally include other film layers (such as but not limited to a dielectric material layer) on its surface, and in the cases where the normal contact surface 26N of electrode 26 and the normal contact surface 28N of electrode 28 are in contact with the driving substrate 10 through these layers, these cases still belong to the above-mentioned in-direct-contact mode. Moreover, in some embodiments, the electrode 26 and the electrode 28 are between the bonding pad 12-1 and the bonding pad 12-2, Moreover, in some embodiments, the isolation structure 18 is between the electrode 26 and the electrode 28. The isolation structure 18 may be used to prevent the electrode 26 and the electrode 28 from being in contact with each other and causing a short circuit during the (thermo-)compression bonding process.

As shown in FIG. 1B, the micro LED structure 20 is laterally connected to the bonding pad 12-1 and the bonding pad 12-2 on the driving substrate 10 by the side contact surface 26S of the electrode 26 and the side contact surface 28S of the electrode 28 respectively. Therefore, when the micro LED structure 20 is failed, the contact surface (i.e., the side contact surface 26S of the electrode 26) between the electrode 26 and the bonding pad 12-1 and the contact surface (i.e., the side contact surface 28S of the electrode 28) between the electrode 28 and the bonding pad 12-2 may be irradiated from the back surface 10B of the driving substrate 10 by the laser LS to debond the faulty micro LED structure 20. However, in other embodiments not shown in the figures, the laser LS may also irradiate the aforementioned contact surface from the front surface of the driving substrate 10.

Since the bonding pad 12-1 and the bonding pad 12-2 are only partially melted at the contact surface between the electrode 26 and the bonding pad 12-1 and the contact surface between the electrode 28 and the bonding pad 12-2, after the micro LED structure 20 is removed, the bonding pad 12-1 and the bonding pad 12-2 may be reused. That is, there is no need to reserve other spaces for additional bonding pads or to re-make bonding pads on the driving substrate 10. In addition, the space of the removed micro LED structure 20 may directly accommodate (bond) a new micro LED structure.

Figure 2:
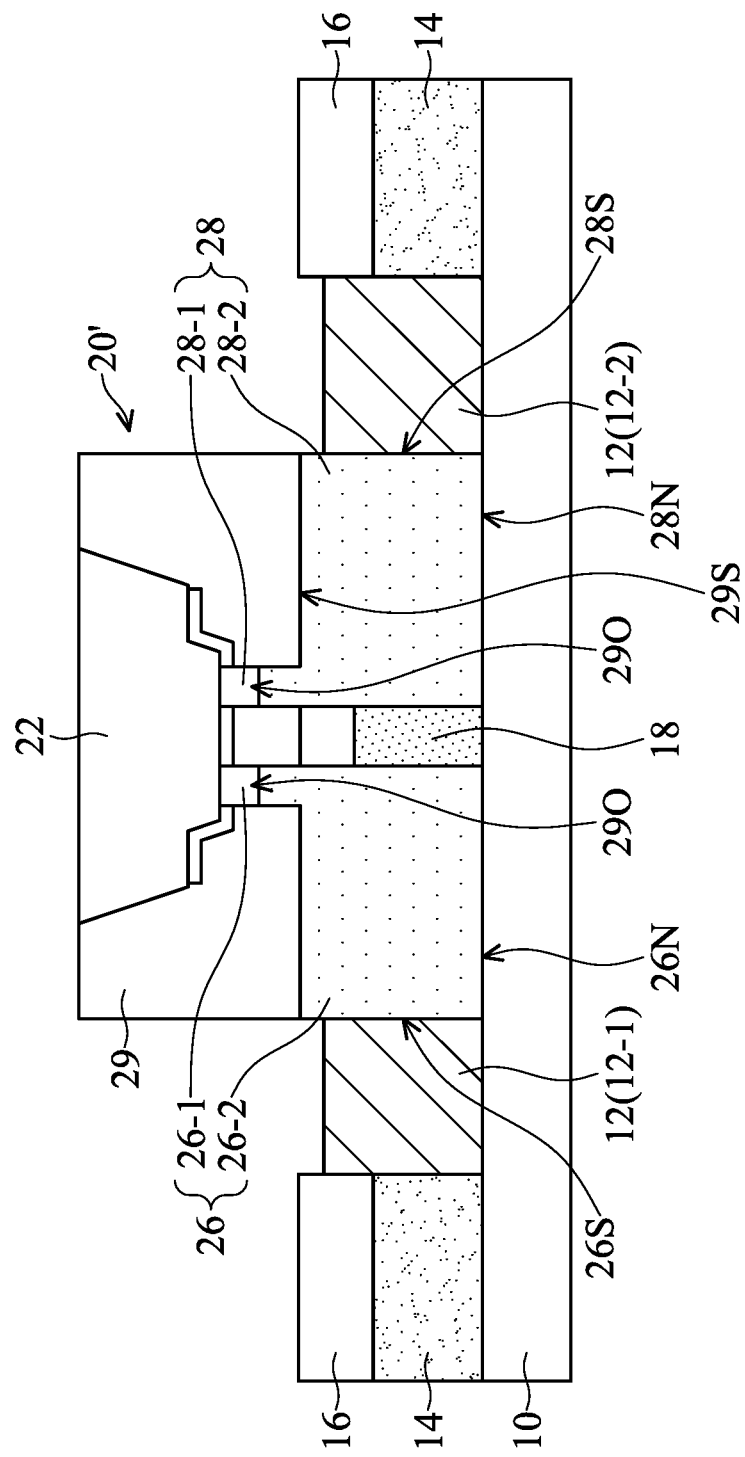
FIG. 2 is a partial cross-sectional view illustrating the micro LED display panel according to an embodiment of the present disclosure.

FIG. 2 is a partial cross-sectional view illustrating the micro LED display panel 102 according to an embodiment of the present disclosure. Similarly, some components of the micro LED display panel 102 have been omitted in FIG. 2 in order to show the technical features of the embodiments of the present disclosure more clearly.

Referring to FIG. 2, the micro LED display panel 102 has a structure similar to that of the micro LED display panel 100 shown in FIG. 1B. The main difference is that the micro LED structure 20' of the micro LED display panel 102 shown in FIG. 2 further includes a molding layer 29 disposed on the side of the micro LED structure 20' facing the driving substrate 10. As shown in FIG. 2, the molding layer 29 has holes 29O, and a portion of the electrode 26 and a portion of the electrode 28 are disposed in the holes 29O.

The electrode 26 has a body portion 26-1 and an extension portion 26-2, and the extension portion 26-2 is connected to the body portion 26-1 and extends to the surface 29S of the molding layer 29 facing the driving substrate 10 through the hole 29O. Similarly, the electrode 28 has a body portion 28-1 and an extension portion 28-2, and the extension portion 28-2 is connected to the body portion 28-1 and extends to the surface 29S of the molding layer 29 facing the driving substrate 10 through the hole 29O.

In other words, in FIG. 2, two electrodes (26 and 28) are laterally connected to the corresponding bonding pads (12-1 and 12-2) by, the side contact surfaces (26S and 28S) of their extension portions (26-2 and 28-2) respectively. In this embodiment, the bonding pads 12 (e.g., 12-1 and 12-2) are in direct contact with the extension portions (26-2 and 28-2) of two electrode (26 and 28) of the micro LED structure 20'.

Since the height of the body portions (26-1 and 28-1) of the electrodes (26 and 28) (i.e., the ohmic contact area on the side surface) will be limited as the size of the micro LED structure 20' shrinks, in the embodiment shown in FIG. 2, the extension portions (26-2 and 28-2) help to enlarge the contact area between the electrodes (26 and 28) and the two bonding pads (12-1 and 12-2), thereby ensuring the bonding yield while optimizing the electroluminescence efficiency.

In some embodiments, the orthogonal projection of the extension portion 26-2 of the electrode 26 on the driving substrate 10 completely covers the orthogonal projection of the body portion 26-1 of the electrode 26 on the driving substrate 10. Similarly, in some embodiments, the orthogonal projection of the extension portion 28-2 of the electrode 28 on the driving substrate 10 completely covers the orthogonal projection of the body portion 28-1 of the electrode 28 on the driving substrate 10.

Figure 3:
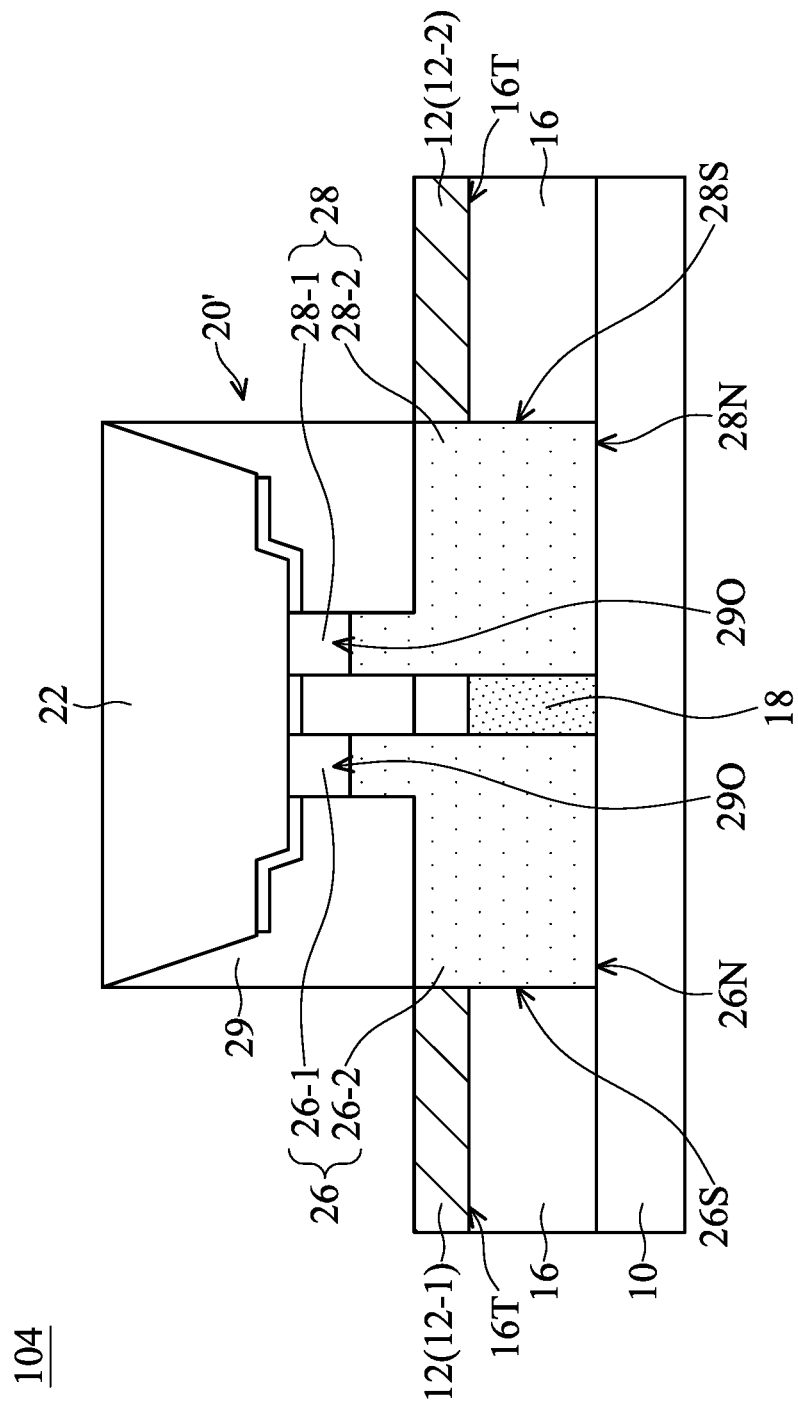
FIG. 3 is a partial cross-sectional view illustrating the micro LED display panel according to another embodiment of the present disclosure.
Figure 4:
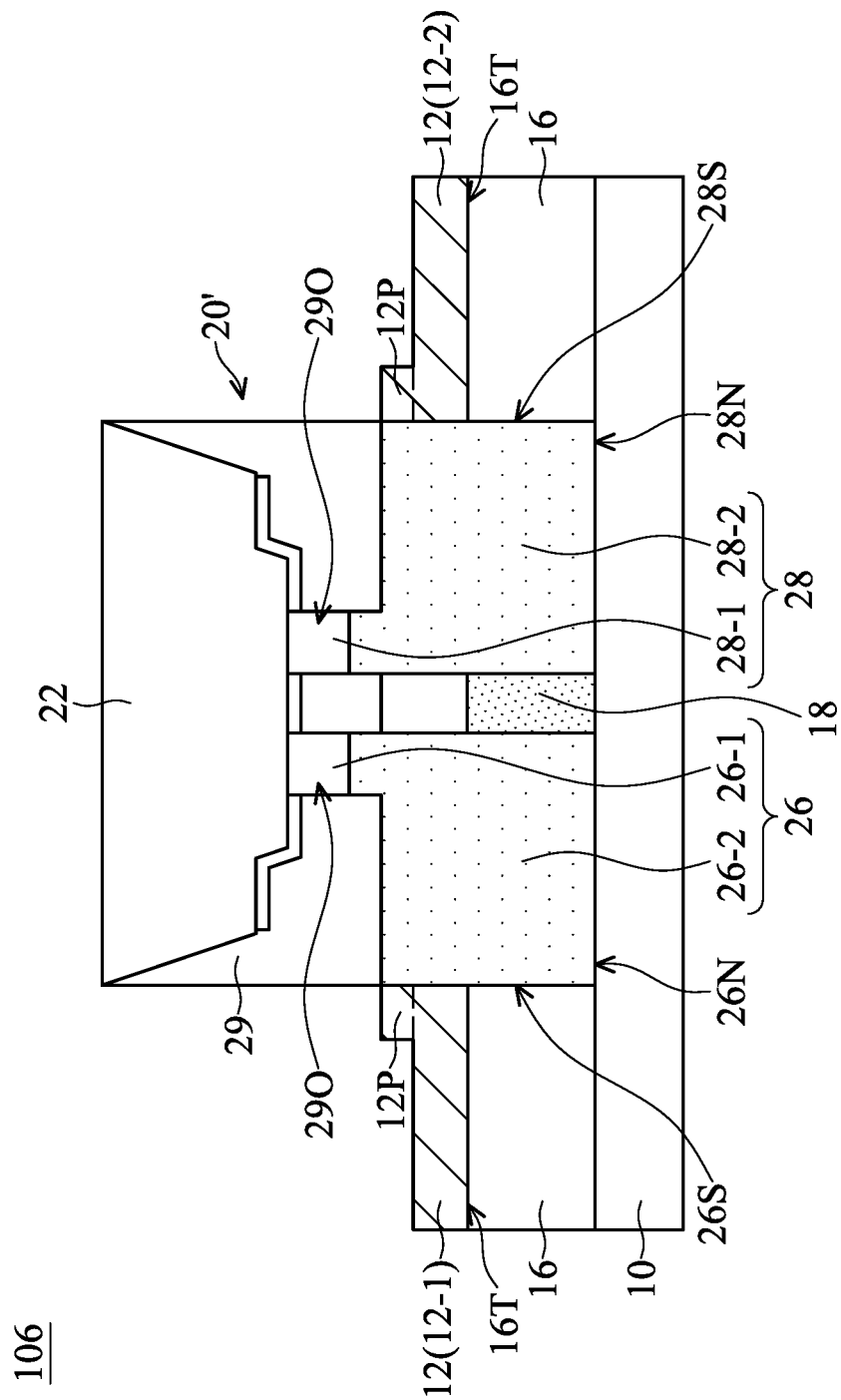
FIG. 4 is a partial cross-sectional view illustrating the micro LED display panel according to another embodiment of the present disclosure.
Figure 5:
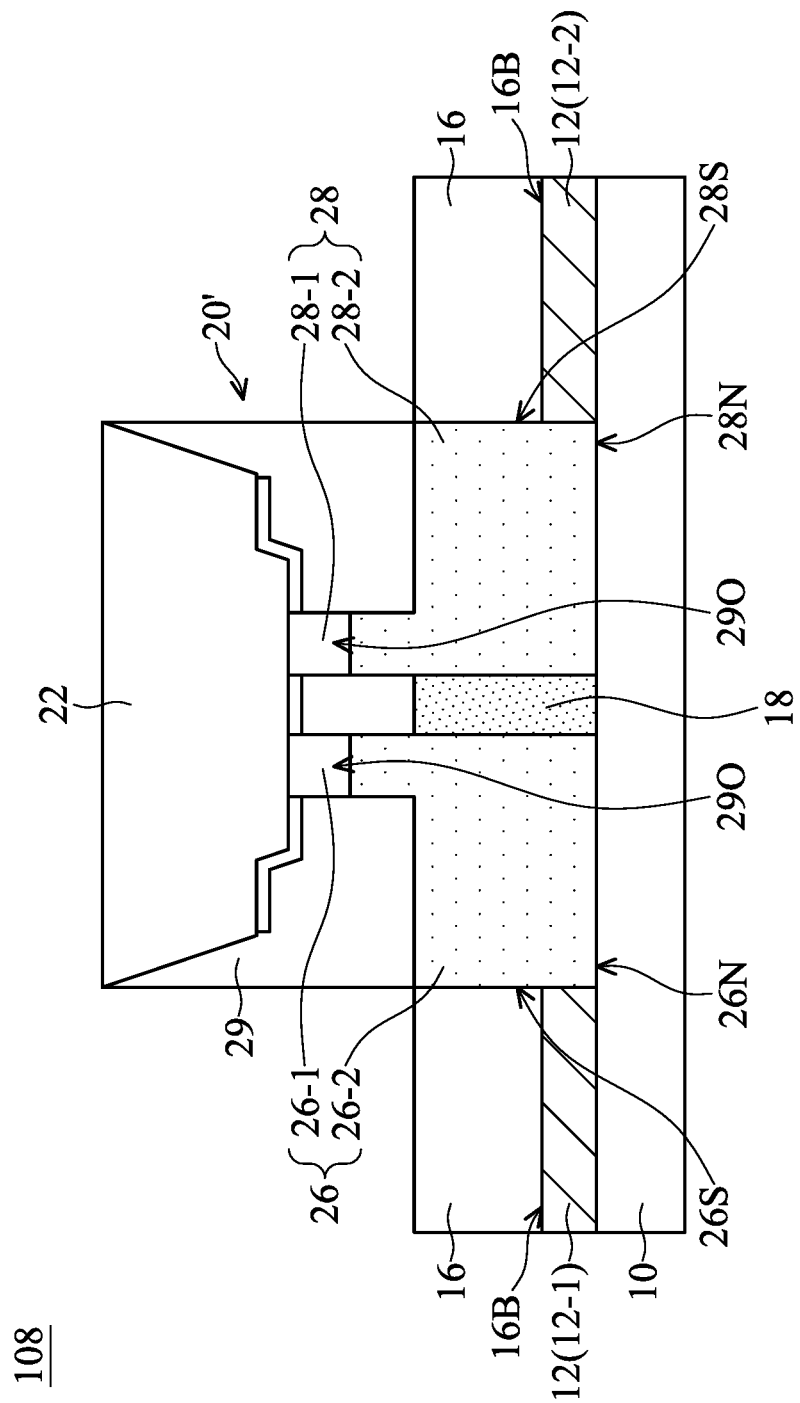
FIG. 5 is a partial cross-sectional view illustrating the micro LED display panel according to another embodiment of the present disclosure.
Figure 6:
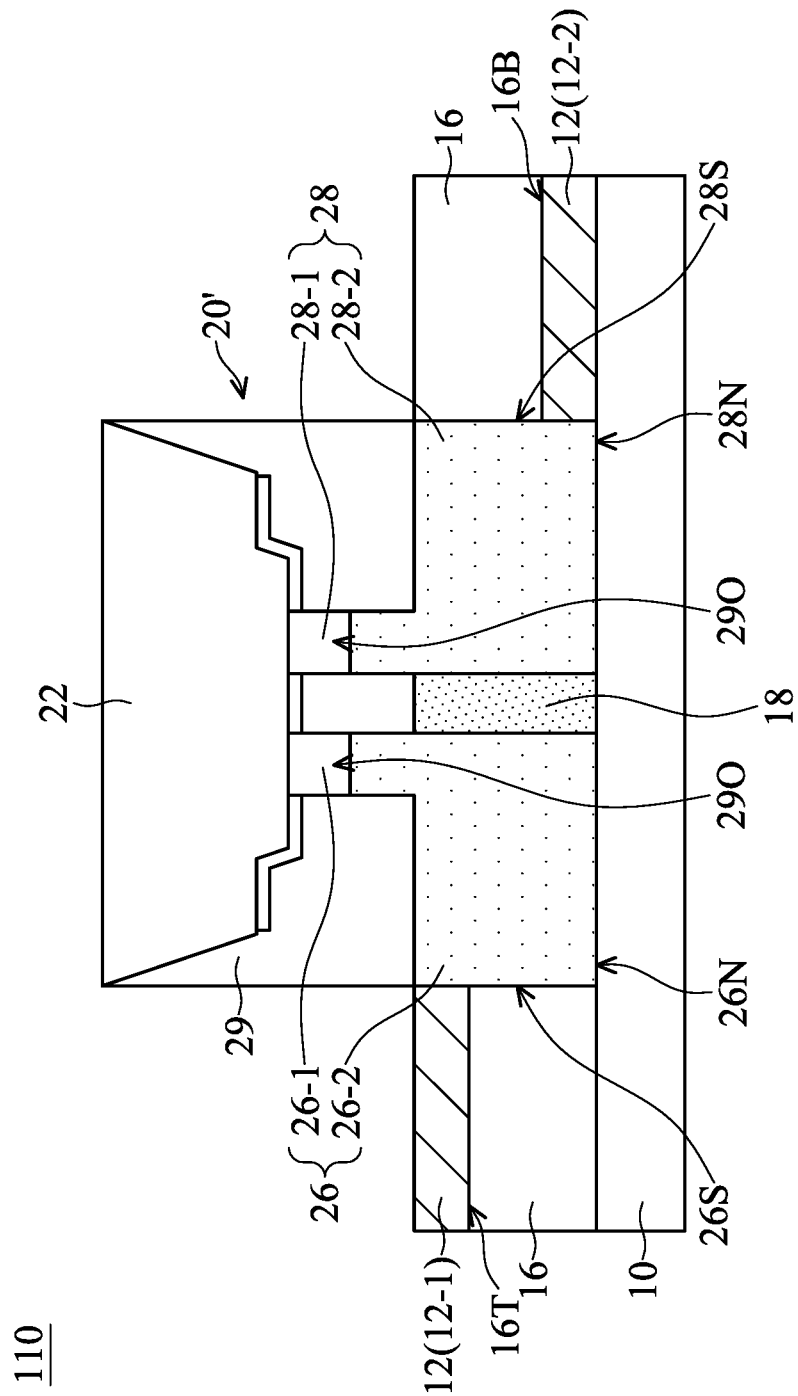
FIG. 6 is a partial cross-sectional view illustrating the micro LED display panel according to another embodiment of the present disclosure.

FIG. 3 is a partial cross-sectional view illustrating the micro LED display panel 104 according to another embodiment of the present disclosure. FIG. 4 is a partial cross-sectional view illustrating the micro LED display panel 106 according to another embodiment of the present disclosure. FIG. 5 is a partial cross-sectional view illustrating the micro LED display panel 108 according to another embodiment of the present disclosure. FIG. 6 is a partial cross-sectional view illustrating the micro LED display panel 110 according to another embodiment of the present disclosure. Similarly, some components of the micro LED display panel 104, the micro LED display panel 106, the micro LED display panel 108, and the micro LED display panel 110 have been omitted in FIG. 3 to FIG. 6 in order to show the technical features of the embodiments of the present disclosure more clearly.

Referring to FIG. 3, the micro LED display panel 104 has a structure similar to that of the micro LED display panel 102 shown in FIG. 2. The main difference is that the bonding pad 12 (e.g., the bonding pad 12-1 or the bonding pad 12-2) of the micro LED display panel 104 shown in FIG. 3 is disposed on the passivation layer 16. In particular, the bonding pad 12 (e.g., the bonding pad 12-1 or the bonding pad 12-2) is disposed on the top surface 16T of the passivation layer 16 and in direct contact with the passivation layer 16.

Referring to FIG. 4, the micro LED display panel 106 has a structure similar to that of the micro LED display panel 104 shown in FIG. 3. The main difference is that the bonding pad 12 (e.g., the bonding pad 12-1 or the bonding pad 12-2) of the micro LED display panel 106 shown in FIG. 4 has a protruding part 12P, and the protruding part 12P may further increase the contact area between the bonding pad 12 (e.g., the bonding pad 12-1 or the bonding pad 12-2) and (the extension portion 26-2 of) the electrode 26 or the (the extension portion 28-2 of) the electrode 28.

Referring to FIG. 5, the micro LED display panel 108 has a structure similar to that of the micro LED display panel 102 shown in FIG. 2. The main difference is that the bonding pad 12 (e.g., the bonding pad 12-1 or the bonding pad 12-2) of the micro LED display panel 108 shown in FIG. 5 is disposed between the driving substrate 10 and the passivation layer 16. In particular, the bonding pad 12 (e.g., the bonding pad 12-1 or the bonding pad 12-2) is disposed on the bottom surface 16B of the passivation layer 16 and in direct contact with the driving substrate 10 and the passivation layer 16.

Referring to FIG. 6, the micro LED display panel 110 has a structure similar to that of the micro LED display panel 102 shown in FIG. 2. The main difference is that one bonding pad 12 (e.g., the bonding pad 12-1) of the micro LED display panel 110 shown in FIG. 6 is disposed on the passivation layer 16, and another bonding pad 12 (e.g., the bonding pad 12-2) of the micro LED display panel 110 shown in FIG. 6 is disposed between the driving substrate 10 and the passivation layer 16. In particular, the bonding pad 12-1 is disposed on the top surface 16T of the passivation layer 16 and in direct contact with the passivation layer 16, and the bonding pad 12-2 is disposed on the bottom surface 16B of the passivation layer 16 and in direct contact with the driving substrate 10 and the passivation layer 16.

In summary, in the micro LED display panels (104, 106, 108, and 110) shown in FIG. 3 to FIG. 6, the bonding pads 12 may be arranged at positions corresponding to the distribution layers 14 in FIG. 2. In other words, since the present disclosure adopts a laterally connected structure and the micro LED structure 20 (or 20') may still be reused after the laser trimming process, in the embodiments shown in the foregoing drawings, the bonding pads 12 may also refer to a part of the circuit layout of the distribution layers 14 and is not limited to the independent element illustrated in FIG. 2.

Figure 7:
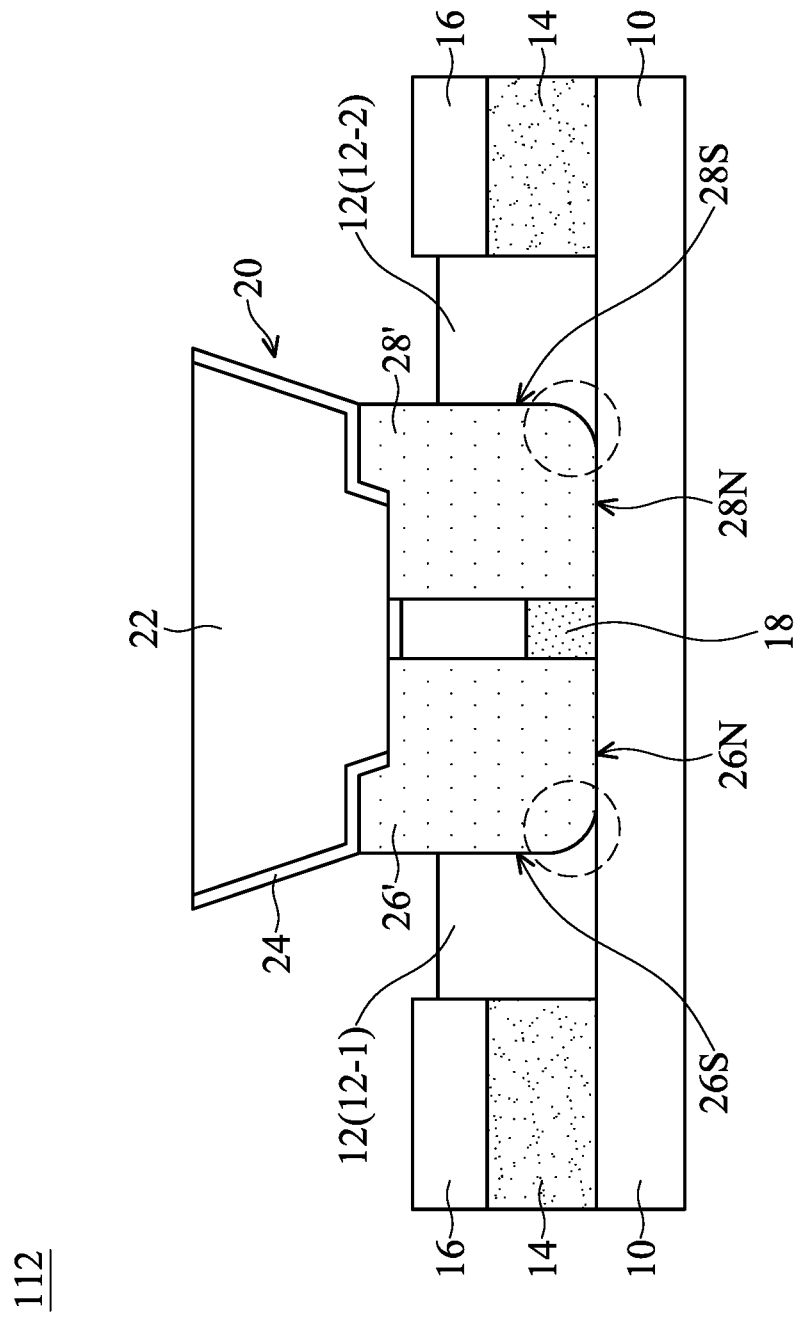
FIG. 7 is a partial cross-sectional view illustrating the micro LED display panel according to an embodiment of the present disclosure.
Figure 8:
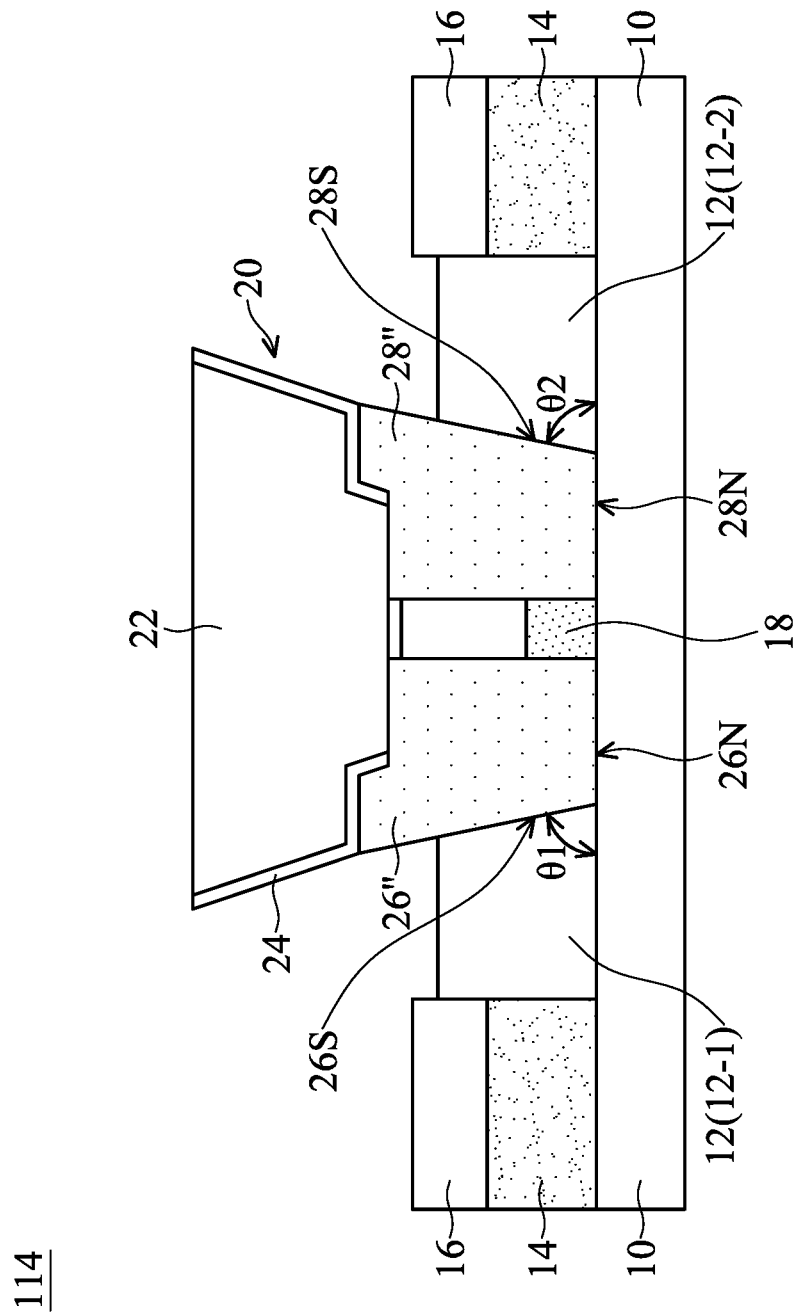
FIG. 8 is a partial cross-sectional view illustrating the micro LED display panel according to another embodiment of the present disclosure.

FIG. 7 is a partial cross-sectional view illustrating the micro LED display panel 112 according to an embodiment of the present disclosure. FIG. 8 is a partial cross-sectional view illustrating the micro LED display panel 114 according to another embodiment of the present disclosure. Similarly, some components of the micro LED display panel 112 and the micro LED display panel 114 have been omitted in FIG. 7 and FIG. 8 in order to show the technical features of the embodiments of the present disclosure more clearly.

Referring to FIG. 7, the micro LED display panel 112 has a structure similar to that of the micro LED display panel 100 shown in FIG. 1B. The main difference is that the electrode 26' and the electrode 28' of the micro LED display panel 112 shown in FIG. 7 respectively have overlapping areas (i.e., the rounded corners enclosed by the dotted circle in FIG. 7), so that the orthogonal projections of the electrode 26' and the electrode 28' on the driving substrate 10 partially overlap the orthogonal projection of the corresponding bonding pads 12 (i.e., the bonding pads 12-1 and 12-2) on the driving substrate 10.

In some embodiments, the orthogonal projection of the electrode 26' on the driving substrate 10 and the orthogonal projection of the corresponding bonding pad 12 (i.e., the bonding pad 12-1) on the driving substrate 10 have an overlapping area, and the overlapping area takes up less than 30% of the area of the orthogonal projection of the electrode 26' on the driving substrate 10. Similarly, in some embodiments, the overlapping area of the orthogonal projection of the electrode 28' on the driving substrate 10 and the orthogonal projection of the corresponding bonding pad 12 (i.e., the bonding pad 12-2) on the driving substrate 10 takes up less than 30% of the area of the orthogonal projection of the electrode 28' on the driving substrate 10.

In general, when the electrodes of the micro LED are bonded to the bumps (e.g., the bonding pads) on the substrate, a horizontal shift may likely occur. In the embodiment shown in FIG. 7, since each micro LED structure 20 is laterally (or substantially vertically) connected to the corresponding bonding pad 12-1 and bonding pad 12-2 on the driving substrate 10 by the side contact surface 26S of the electrode 26' and the side contact surface 28S of the electrode 28', respectively, the bonding pad 12-1 and the bonding pad 12-2 will automatically adapt to the shape of the electrode 26' and the electrode 28' to fill the gap there, so that the electrical conductivity of the micro LED structure 20 and the driving substrate 10 will not be affected by the horizontal shift.

The shape of the overlapping areas of the electrode 26' and of the electrode 28' (i.e., the rounded corners enclosed by the dotted circle in FIG. 7) is formed, for example, because the patterned distance between the bonding pad 12-1 and the bonding pad 12-2 (i.e., the shortest distance between the bonding pad 12-1 and the bonding pad 12-2 in the horizontal direction) is slightly smaller than the boundary width of the electrode 26' and the electrode 28' (i.e., the longest distance between the electrode 26' and the electrode 28' in the horizontal direction), so that the micro LED structure 20 will naturally press the bonding pad 12-1 and the bonding pad 12-2 during the compression process to form an overlapping area. In other words, it means that the two electrodes (i.e., the electrode 26' and the electrode 28') and the bonding pads 12 (i.e., the bonding pad 12-1 and the bonding pad 12-2) are in close contact.

Therefore, in the embodiments of the present disclosure, it does not increase the risk of short circuit to shorten the distance between the bonding pads 12 e.g., the bonding pad 12-1 and the bonding pad 12-2) because the bonding pads may be separated by the micro LED structure 20. In contrast, in a general micro LED display panel, since the electrodes of the micro LED are frontally bonded (i.e., normally bonded) to bumps (e.g., bonding pads) on the substrate, the aforementioned effect cannot be achieved, and it may increase the risk of short circuit to shorten the distance (pitch) between the bumps.

Referring to FIG. 8, the micro LED display panel 114 has a structure similar to that of the micro LED display panel 100 shown in FIG. 1B. The main difference is that in the micro LED display panel 114 shown in FIG. 8, the side contact surface 26S where the electrode 26" is laterally connected to the corresponding bonding pad 12 (i.e., the bonding pad 12-1) is an inclined surface. Similarly, the side contact surface 28S where the electrode 28" is laterally connected to the corresponding bonding pad 12 (i.e., the bonding pad 12-2) is also an inclined surface.

As shown in FIG. 8, in some embodiments, the included angle θ1 between the side contact surface 26S of the electrode 26" and the driving substrate 10 is greater than about 45 degrees and less than about 90 degrees. Similarly, in some embodiments, the included angle θ2 between the side contact surface 28S of the electrode 28" and the driving substrate 10 is greater than about 45 degrees and less than about 90 degrees. In the embodiment shown in FIG. 8, the included angle θ1 is the same as the included angle θ2, but the present disclosure is not limited thereto. In some other embodiments, the included angle θ1 is different from the included angle θ2.

FIG. 9 to FIG. 13 are different examples of the bonding pads 12 (that include the bonding pad 12-1 and the bonding pad 12-2). In addition, FIG. 9 to FIG. 13 also illustrate the passivation layer 16 in order to more clearly show the corresponding relationship between the bonding pad 12-1 and the bonding pad 12-2. However, it should be noted that not all micro LED display panels need to include the passivation layer 16.

Figure 9:
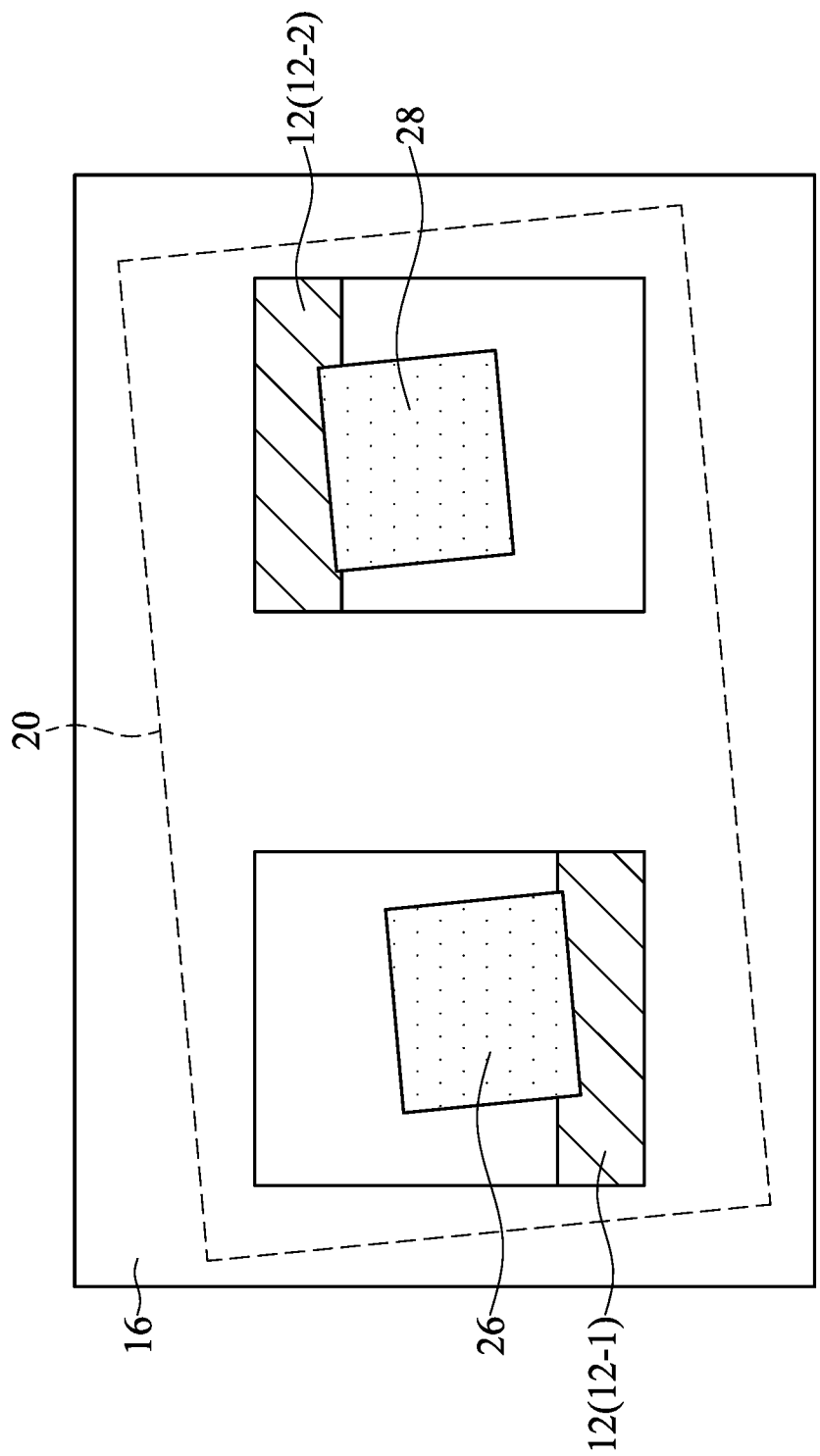
FIG. 9 to FIG. 13 are different examples of the bonding pads.

Referring to FIG. 9, the shape of the bonding pad 12-1 and the shape of the bonding pad 12-2 are straight-line shapes, and the bonding pad 12-1 and the bonding pad 12-2 are arranged as a pair. In the top view shown in FIG. 9, the bonding pad 12-1 and the bonding pad 12-2 are centrosymmetric. When the micro LED structure 20 and the driving substrate 10 are bonded, even if there is an alignment error between the micro LED structure 20 and the driving substrate 10 (e.g., the case shown in FIG. 9), the bonding pad 12-1 and the bonding pad 12-2 may still be laterally connected to the electrode 26 and the electrode 28. That is, the lateral connection provides a function that the bonding pad 12-1 and the bonding pad 12-2 to be stopped by abutting against the electrode 26 and the electrode 28, which may be used to correct the alignment error caused by the horizontal shift or rotation during the alignment.

Figure 10:
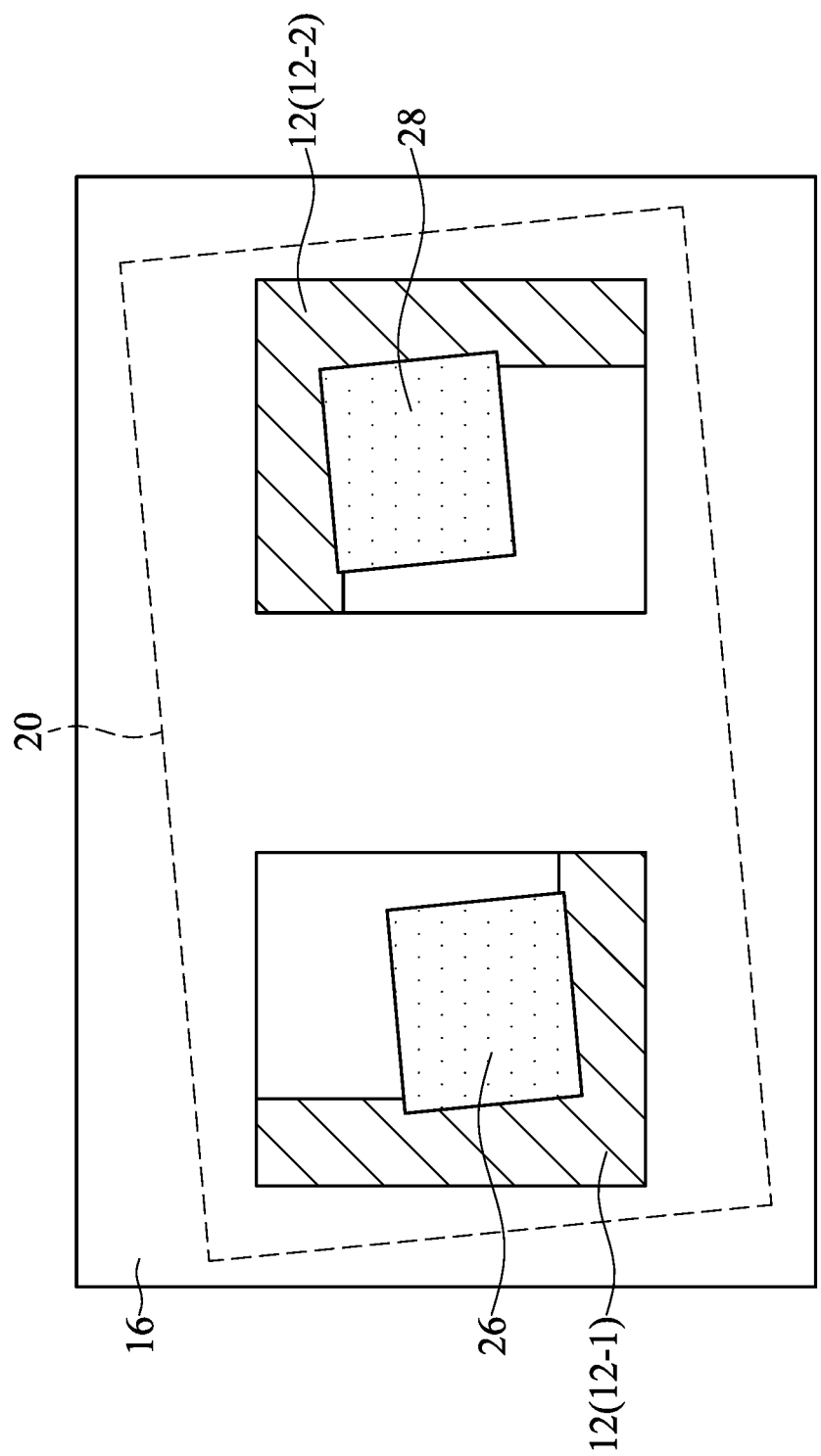

Referring to FIG. 10, the shape of the bonding pad 12-1 and the shape of the bonding pad 12-2 are L shapes, and the bonding pad 12-1 and the bonding pad 12-2 are arranged as a pair. In the top view shown in FIG. 10, the bonding pad 12-1 and the bonding pad 12-2 are centrosymmetric. When the micro LED structure 20 and the driving substrate 10 are bonded, even if there is an alignment error between the micro LED structure 20 and the driving substrate 10 (e.g., the case shown in FIG. 10), the bonding pad 12-1 and the bonding pad 12-2 may still be laterally connected to the electrode 26 and the electrode 28. That is, the bonding pad 12-1 and the bonding pad 12-2 are provided with the stopping effect, which may be used to correct the alignment error caused by the horizontal shift or rotation during the alignment.

In addition, in FIG. 9 and FIG. 10, the configurations of the bonding pad 12-1 and the bonding pad 12-2 are also anti-symmetric. That is, in the arrangement area of the drive substrate 10, the orthogonal projection patterns of the bonding pad 12-1 and the bonding pad 12-2 are upside-down and left-right opposite to each other based on their center lines.

Figure 11:
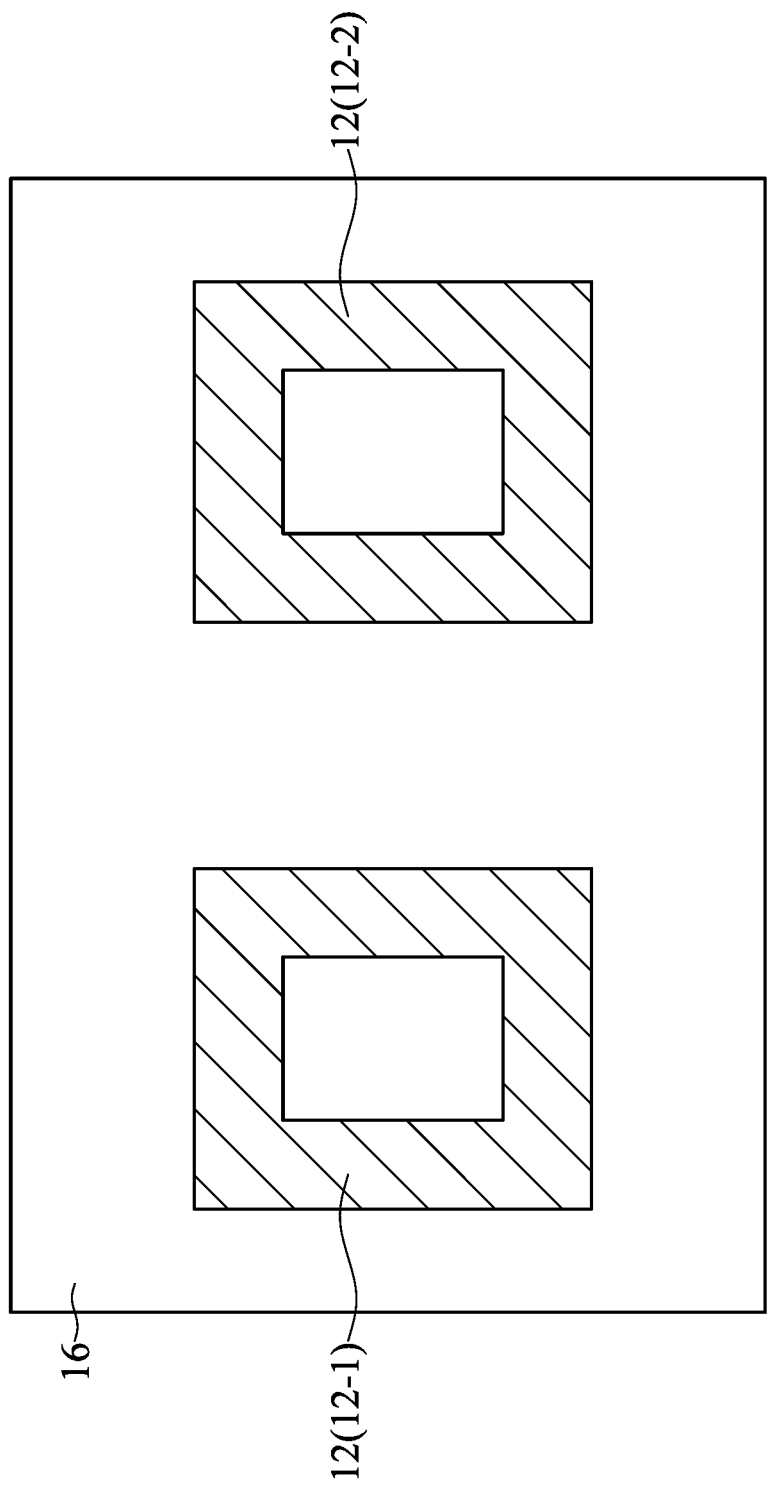
Figure 12:
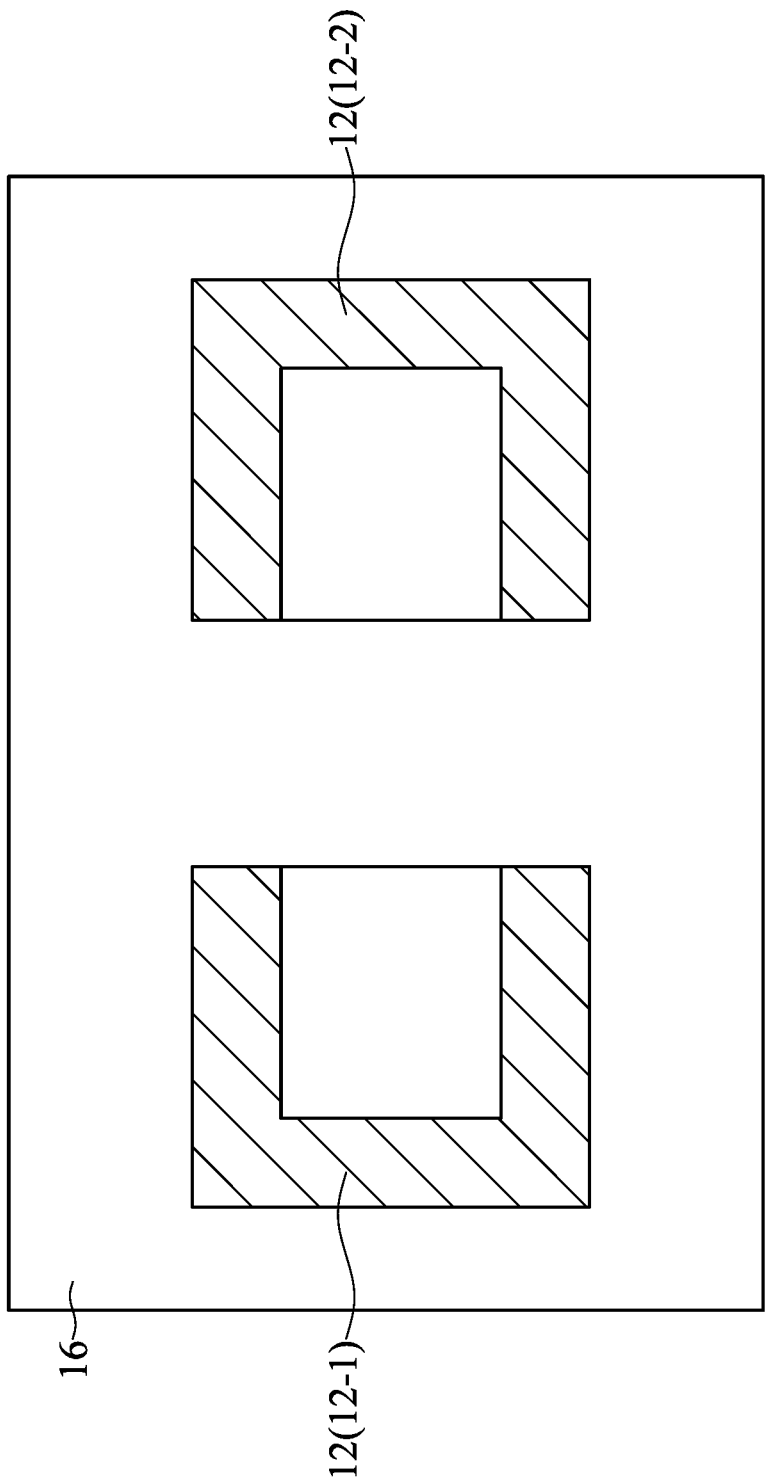
Figure 13:
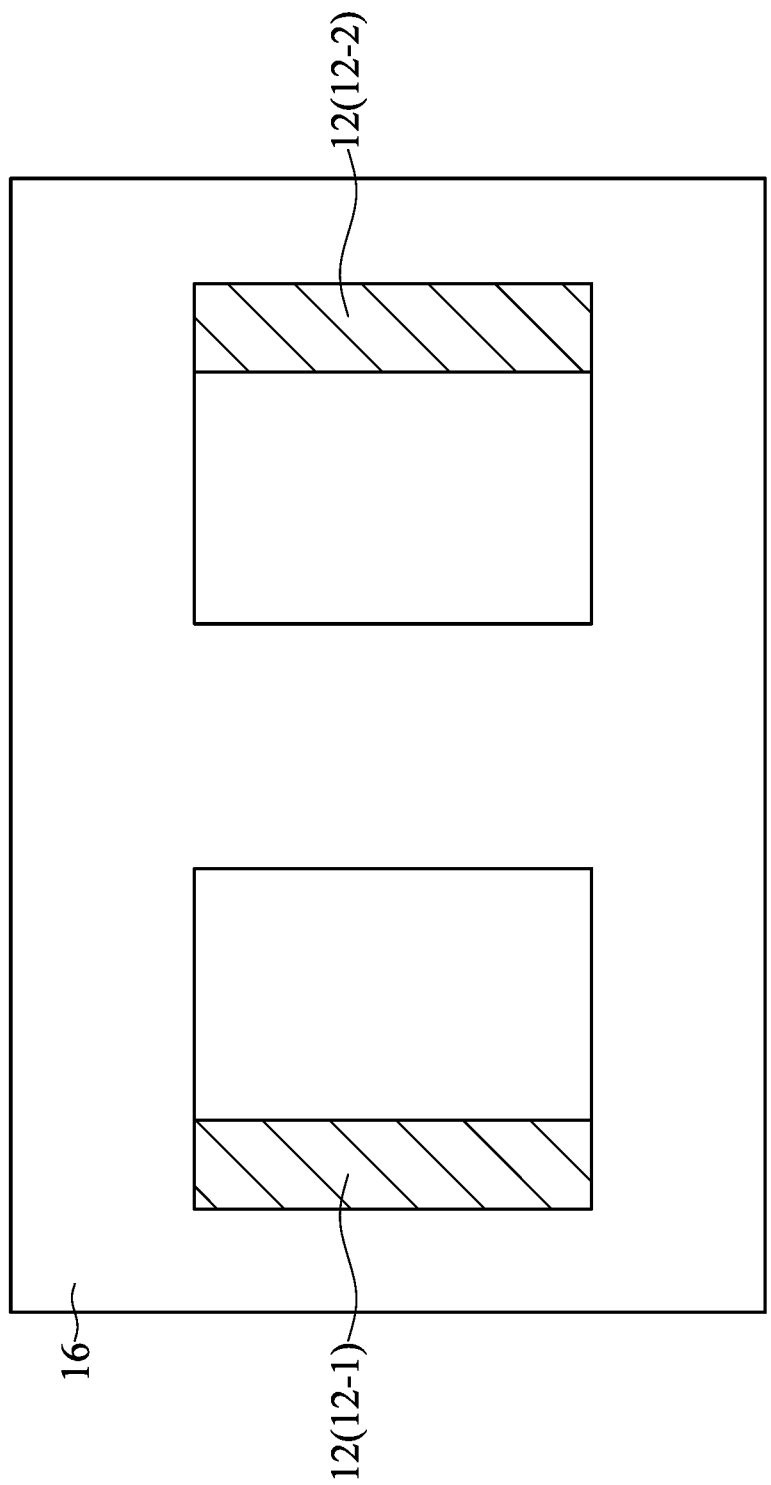

The electrode 26 and the electrode 28 (and the micro LED structure 20) will be omitted in FIG. 11 to FIG. 13, and the stopping effect produced by the bonding pad 12-1 and the bonding pad 12-2 in FIG. 11 to FIG. 13 will not be repeated.

Referring to FIG. 11, the shape of the bonding pad 12-1 and the shape of the bonding pad 12-2 are hollow squares, and the bonding pad 12-1 and the bonding pad 12-2 are arranged as a pair. In the top view shown in FIG. 11, the bonding pad 12-1 and the bonding pad 12-2 are axial symmetric and centrosymmetric.

Referring to FIG. 12, the shape of the bonding pad 12-1 and the shape of the bonding pad 12-2 are U shapes, the openings of the U shapes face each other, and the bonding pad 12-1 and the bonding pad 12-2 are arranged as a pair. In the top view shown in FIG. 12, the bonding pad 12-1 and the bonding pad 12-2 are axial symmetric and centrosymmetric.

Referring to FIG. 12, the shape of the bonding pad 12-1 and the shape of the bonding pad 12-2 are straight-line shapes, and the bonding pad 12-1 and the bonding pad 12-2 are arranged as a pair. In the top view shown in FIG. 13, the bonding pad 12-1 and the bonding pad 12-2 are axial symmetric and centrosymmetric.

Concluding the foregoing paragraphs and the descriptions in FIG. 9 to FIG. 13, it can be seen that since the micro LED structure and the drive substrate are bonded by the pressure from front side, when the position is aligned, various factors may cause alignment errors from the horizontal shift. In the present disclosure, since the bonding pad 12-1 and the bonding pad 12-2 are arranged on the sides of the electrode 26 and the electrode 28 (both in the horizontal direction), even if the aforementioned error situation exists, the bonding yield of the micro LED structure will not be affected. Furthermore, for example, in FIG. 9 and FIG. 10, the horizontal shift or rotation of the electrode 26 and the electrode 28 may increase the contact area with the bonding pad 12-1 and the bonding pad 12-2.

As noted above, in the embodiments of the present disclosure, since each micro LED structure is laterally connected to the bonding pad on the driving substrate by the side contact surface of the electrode, when the contact surface between the electrode and the bonding pad is irradiated (for example from the back of the driving substrate) by the laser to debond the faulty micro LED structure, the bonding pad is only partially melted at the contact surface. Therefore, the bonding pad may be reused, and there is no need to reserve other spaces for additional bonding pads or to re-make bonding pad. In addition, the space of the removed micro LED structure may directly accommodate (bond) a new micro LED structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro LED display panel, comprising:
 a driving substrate;
 a plurality of bonding pads disposed on the driving substrate and spaced apart from each other; and a plurality of micro LED structures electrically connected to the bonding pads, wherein each of the micro LED structures comprises:
  at least one electrode disposed on a side of each of the micro LED structures facing the driving substrate, wherein the electrode has a normal contact surface and a side contact surface, the normal contact surface faces and is in direct contact with the driving substrate, the side contact surface is laterally connected to one of the bonding pads, the electrode and the one of the bonding pads are respectively disposed on two sides of the side contact surface, and at least a portion of the one of the bonding pads on the side opposite the electrode is exposed to a surface of the driving substrate with respect to the electrode.

2. The micro LED display panel as claimed in claim 1, wherein an orthogonal projection of the electrode on the driving substrate and an orthogonal projection of a corresponding one of the bonding pads on the driving substrate have an overlapping area, and the overlapping area takes up less than 30% of an area of the orthogonal projection of the electrode on the driving substrate.

3. The micro LED display panel as claimed in claim 1, wherein the at least one electrode comprises a first electrode and a second electrode, a side contact surface of the first electrode and a side contact surface of the second electrode are respectively connected to two of the bonding pads, and the first electrode and the second electrode are between the two of the bonding pads.

4. The micro LED display panel as claimed in claim 1, wherein each of the micro LED structures further comprises:
  a molding layer disposed on the side of each of the micro LED structures facing the driving substrate and having at least one hole, wherein at least a portion of the electrode is disposed in the hole;
  wherein the electrode has a body portion and an extension portion, and the extension portion is connected to the body portion and extends to a surface of the molding layer facing the driving substrate through the hole.

5. The micro LED display panel as claimed in claim 4, wherein an orthogonal projection of the extension portion on the driving substrate completely covers an orthogonal projection of the body portion on the driving substrate.

6. The micro LED display panel as claimed in claim 4, wherein the at least one electrode comprises a first electrode and a second electrode, the molding layer has two holes, part of the first electrode is disposed in one of the holes, and part of the second electrode is disposed in another of the holes.

7. The micro LED display panel as claimed in claim 1, wherein the at least one electrode comprises a first electrode and a second electrode, and the micro LED display panel further comprises:
  a plurality of isolation structures disposed on a side of the driving substrate facing the micro LED structures, wherein each of the isolation structure is between the first electrode and the second electrode.

8. The micro LED display panel as claimed in claim 1, wherein the bonding pads comprise a first bonding pad and a second bonding pad arranged as a pair, and in a top view of the micro LED display panel, the first bonding pad and the second bonding pad are centrosymmetric.

9. The micro LED display panel as claimed in claim 8, wherein a shape of an orthogonal projection of the first bonding pad on the driving substrate and an orthogonal projection of the second bonding pad on the driving substrate comprise an L shape, a U shape, a hollow square, or a straight-line shape.

10. The micro LED display panel as claimed in claim 1, wherein an included angle between the side contact surface and the driving substrate is greater than 45 degrees and less than 90 degrees.

\* \* \* \* \*